United States Patent [19]

Chamberlain

[11] Patent Number: 4,473,836

[45] Date of Patent: Sep. 25, 1984

[54] INTEGRABLE LARGE DYNAMIC RANGE PHOTODETECTOR ELEMENT FOR LINEAR AND AREA INTEGRATED CIRCUIT IMAGING ARRAYS

[75] Inventor: Savvas G. Chamberlain, Waterloo, Canada

[73] Assignee: Dalsa Inc., Waterloo, Canada

[21] Appl. No.: 373,972

[22] Filed: May 3, 1982

[51] Int. Cl.³ .................. H01L 27/14; H01L 31/00; H01L 29/78; H01L 33/00

[52] U.S. Cl. .................. 357/30; 357/23.1; 357/23.12; 357/24; 357/17; 357/31; 357/32

[58] Field of Search .......... 357/30, 17, 32, 31, 357/30 I, 30 R, 23.12, 24 LR, 23.1

[56] References Cited

U.S. PATENT DOCUMENTS

| | | |
|---|---|---|
| 3,400,383 | 9/1968 | Meadows et al. . |
| 3,426,255 | 2/1969 | Heywang . |
| 3,453,887 | 7/1969 | Wooten . |
| 3,571,593 | 3/1971 | Komatsubara . |
| 3,577,047 | 5/1971 | Cheroff .................. 357/23 R |
| 3,745,424 | 7/1973 | Ohuchi et al. . |
| 3,781,831 | 12/1973 | Neugebauer et al. . |
| 4,005,318 | 1/1977 | Claiborne . |
| 4,024,560 | 5/1977 | Miller et al. . |
| 4,132,998 | 1/1979 | Dingwall . |
| 4,148,048 | 4/1979 | Takemoto et al. .......... 357/24 |
| 4,153,906 | 5/1979 | Shinoda et al. . |
| 4,166,957 | 9/1979 | Jantsch . |
| 4,190,849 | 2/1980 | Powell . |
| 4,242,694 | 12/1980 | Koike et al. .......... 357/30 |
| 4,268,845 | 5/1981 | Koike et al. .......... 357/30 |
| 4,275,405 | 1/1981 | Shannon . |
| 4,346,395 | 8/1982 | Ouchi .................. 357/30 |

OTHER PUBLICATIONS

Gaffney et al., IBM Tech. Dis. Bull., vol. 17, No. 8, May 1975, pp. 3529-3530, "Preventing Overload in Optical Scanners".

Primary Examiner—Martin H. Edlow
Assistant Examiner—Jerome Jackson
Attorney, Agent, or Firm—Sim & McBurney

[57] ABSTRACT

An integrable photodetector element of large dynamic range includes a silicon substrate which has a resistivity of between 1 and 100 ohm-cm. The substrate is of one conductivity type. In the substrate there is an electrically floating photosensitive diffusion region and a second diffusion region that is spaced apart from the electrically floating region by means of a channel in the substrate. The two diffusion regions are of the same conductivity type and of opposite conductivity type to that of the substrate. A metal-insulator-semiconductor gate spans the substrate between the regions and over the channel. The gate is electrically connected to the electrically floating region, and the second region is reverse biased with respect to the substrate. Except for the photosensitive diffusion region, the element is shielded against penetration by visible light. The length of the channel between the regions, the resistivity of the substrate, the magnitude of the reverse bias and the depth of the diffusion regions is selected so that the potential barrier between the electrically floating region and the channel is low enough that electrons which are photogenerated in response to visible light impinging on the electrically floating region can be injected therefrom into the channel to be collected by the second diffusion region. As a result of this the voltage of the electrically floating region varies logarithmically with changes in visible light incident thereon.

6 Claims, 7 Drawing Figures d = DIFFUSION JUNCTION DEPTH.
L = EFFECTIVE CHANNEL LENGTH.
$V_{D1}$ = POTENTIAL OF THE DIFFUSED REGION D1.
$V_{D2}$ = POTENTIAL OF THE DIFFUSED REGION D2.

INTEGRABLE LARGE DYNAMIC RANGE PHOTODETECTOR ELEMENT FOR LINEAR AND AREA INTEGRATED CIRCUIT IMAGING ARRAYS

BACKGROUND OF THE INVENTION

This invention relates to solid-state photodector structures which can be integrated on the same chip with MOSFET circuits, or on the same chip with CCD circuits, or on the same chip with both MOSFET and CCD circuits.

Silicon MOSFET scanned and CCD scanned solid state photodetector arrays are well reported in the literature and are commercially available. Reference may be made, for example, to Fairchild Technical Data Sheet, "CCD 122/142, 1728/2048 Element Linear Image Sensor Charge Coupled-Device", Mountain View, Calif., April 1979 (reference 1a) and to Reticon product summary "Solid-State Image Sensors, 64 to 1872 Elements RC 1728 H, RC 1024 H", Reticon Corp., Sunnyvale, Calif., 1976 (reference 1b). Such photodetector arrays incorporate either photodiodes or photogates as their photoelements. Such photoelements which operate in the integration mode (see Savvas G. Chamberlain, "Photosensitivity and Scanning of Silicon Image Detector Arrays", IEEE Journal of Solid-State Circuits, Vol. SC-4, No. 6, pp 333–342, December 1969 -reference 2a) have a detecting light intensity dynamic range of from about 200 to a maximum of about 5000.

A normal silicon photodiode operating in the solar cell mode, i.e., photovoltaic mode (see Aldert Van Der Ziel, "Solid-State Physical Electronics", Third Edition, Prentice Hall, 1976 —reference 2b) would have a detecting light intensity dynamic range of greater than 5000. However, a silicon photodiode operating in the photovoltaic mode is essentially forward biased and cannot be integrated easily on the same silicon chip as MOSFET scanning and readout shift registers, if standard MOSFET silicon technology is used. Moreover, a silicon solar cell cannot be integrated on the same silicon chip with CCD readout and scanning shift registers if standard CCD/MOSFET silicon technology is used.

In laser optical communications and other electronic imaging applications, e.g., document readers, facsimile (telecopier) there is a need for a photodetector structure having a wide light intensity dynamic range, preferably greater than $10^6$, which can be integrated easily on a single silicon chip to form linear and area photodetector arrays. On the same chip with the photodetector arrays would be MOSFET and/or CCD shift registers for scanning.

SUMMARY OF THE INVENTION

A solid-state photodetector structure embodying the instant invention meets the foregoing objectives. In fact, it can provide an analog voltage signal when the light intensity of the incident radiation varies between one and ten million and thus has a light intensity detecting dynamic range of greater than $10^7$.

In accordance with one aspect of this invention there is provided an integrable photodetector element having a large dynamic range comprising a silicon substrate having a resistivity of between 1 and 100 ohm-cm and being of one conductivity type; an electrically floating photosensitive diffusion region in said substrate; a second diffusion region in said substrate spaced apart from said electrically floating photosensitive diffusion region by a channel in said substrate, said diffusion regions both being of the same conductivity type and of opposite conductivity type to that of said substrate; a metal-insulator-semiconductor gate spanning said substrate between said regions and over said channel; means electrically connecting said gate and said electrically floating photosensitive diffusion region; means for reverse biasing said second diffusion region with respect to said substrate; said element except for said photosensitive diffusion region being shielded against penetration by visible light; the length of said channel between said regions, the resistivity of said substrate and the depth of said diffusion regions being selected such that the potential barrier between said electrically floating photosensitive diffusion region and said channel is low enough that electrons photogenerated in response to visible light impinging on said electrically floating photosensitive diffusion region can be injected from said electrically floating photosensitive diffusion region into said channel to be collected by said second diffusion region, the voltage of said electrically floating photosensitive diffusion region thereby varying logarithmically with changes in visible light incident thereon. As a result, the electrically floating photosensitive diffusion region never reaches saturation as the light intensity increases.

DETAILED DESCRIPTION OF THE DRAWINGS

This invention will become more apparent from the following detailed description, taken in conjunction with the appended drawings, in which:

FIG. 5b is a section taken along line 5b—5b in FIG. 5a; and

DETAILED DESCRIPTION OF THE INVENTION INCLUDING THE PREFERRED EMBODIMENT

A photodetector structure embodying the present invention utilizes the principle of electron injection over a potential barrier, which is a logarithmic law. This phenomenon normally is encountered in short-channel MOSFETs, is referred to as a subthreshold effect, and generally is regarded as a very detrimental effect in short-channel MOSFETs (see David B. Scott and Savvas G. Chamberlain, "A Calibrated Model for the Subthreshold Operation of a Short Channel MOSFET Including Surface States," IEEE Journal of Solid-State Circuits, Vol. SC-14, No. 3, pp 633–644, June 1979 reference 3a and, by the same authors, "Modelling and Experimental Simulation of the Low Frequency Transfer Inefficiency in Bucket-Brigade Devices," IEEE Trans. on Electron Devices, Vol. ED-2, No. 2, pp 405-414, February 1980 —reference 3b). However, the inventor of the present invention has discovered a special photodetector structure and principle in which the effect of electron injection over a potential barrier is employed, the effect, far from being detrimental, being useful and important in achieving the desired objectives.

Figure 1:
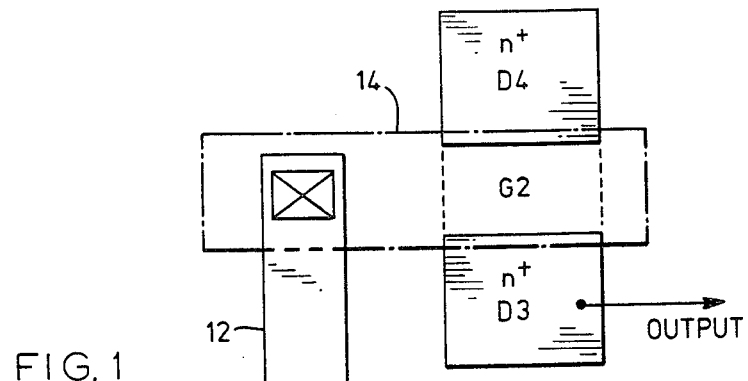
FIG. 1 is a plan view of a photodetector structure embodying the present invention.
Figure 2:
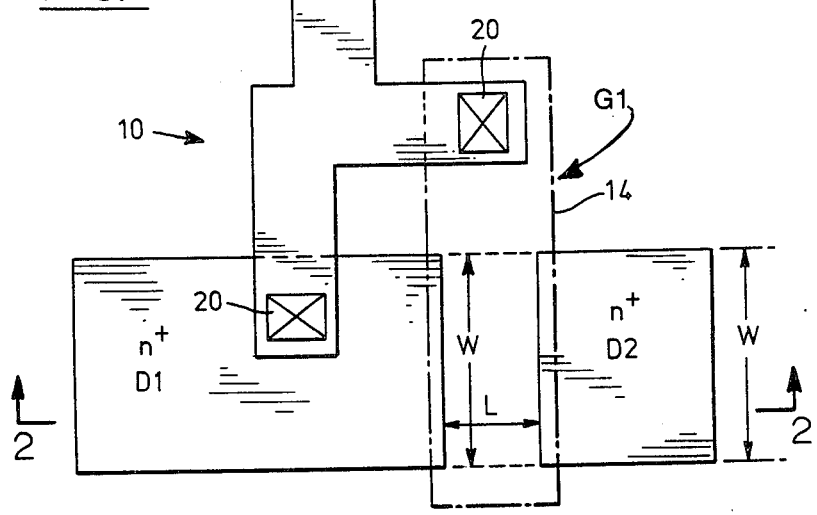
FIG. 2 is a section taken along line 2—2 in FIG. 1.
Figure 2:
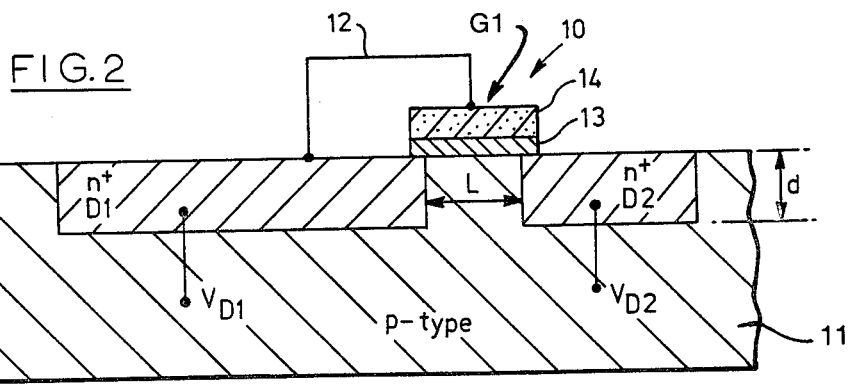

Referring to FIGS. 1 and 2, a photodetector structure 10 embodying the present invention includes a silicon substrate 11 (FIG. 2) having a diffused photosensitive region D1, that functions as a source, and a diffused region D2 that functions as a drain. In the embodiment shown substrate 11 is p type and regions D1 and D2 are n type, but those skilled in the art will appreciate that this could be reversed with substrate 11 being n type and diffused regions D1 and D2 being p type. The photodetector structure also includes a metal-insulator-semiconductor gate G1 which is electrically connected via conductor 12 to diffused photosensitive region D1. In the embodiment illustrated gate G1 includes a layer 13 of $SiO_2$ overlaid by a layer of aluminum or polysilicon 14. If polysilicon is employed, it must be covered to be impervious to light, since polysilicon is transparent.

Substrate 11 has a resistivity in the range of 1 ohm-cm to 100 ohm-cm.

As is indicated by the symbols $n^+$, regions D1 and D2 have greater doping densities than substrate 11, typically at least ten times greater. However, the photodetector structure can function with regions D1 and D2 having any doping density in the practical range of $10^{15}$ $cm^{-3}$ to $10^{21}$ $cm^{-3}$.

It is important to note that diffused photosensitive region D1 is electrically floating. On the other hand, a source of potential 15 (FIGS. 3 and 4) having a potential $V_{D2}$ is connected between region D2 and substrate 11 and reverse biases region D2.

It is important to note that all parts of the photodetector structure are shielded from light except for region D1, the upper surface of which receives and is exposed to light.

The part of structure 10 under gate G1 and between regions D1 and D2 functions as a channel with an effective channel length L. This is the effective electrical length of the channel and is determined by the design channel length, the resistivity of substrate 11, the magnitude of reverse bias $V_{D2}$ and the diffusion junction depths d (FIG. 2) of regions D1 and D2, which depths should be the same. The effective channel length also depends on the ion implant in the channel, if used.

Even though the structure shown operates satisfactorily without ion-implant, if desired ion-implant can be used in the channel region to shape the potential barrier which exists between regions D1 and D2 by locally modifying the resistivity of the substrate.

Referring specifically to FIG. 1, the structure formed by diffusion regions D3 (source) and D4 (drain) in another substrate and metal-insulator-semiconductor gate G2 functions as a normal MOSFET device and is used to sense the voltage of electrically floating diffused photosensitive region D1. As shown in FIG. 1, conductor 12, which is aluminum, but which could be polysilicon, is connected via contact holes 20 to gates G1 and G2 and diffusion region D1.

Figure 3:
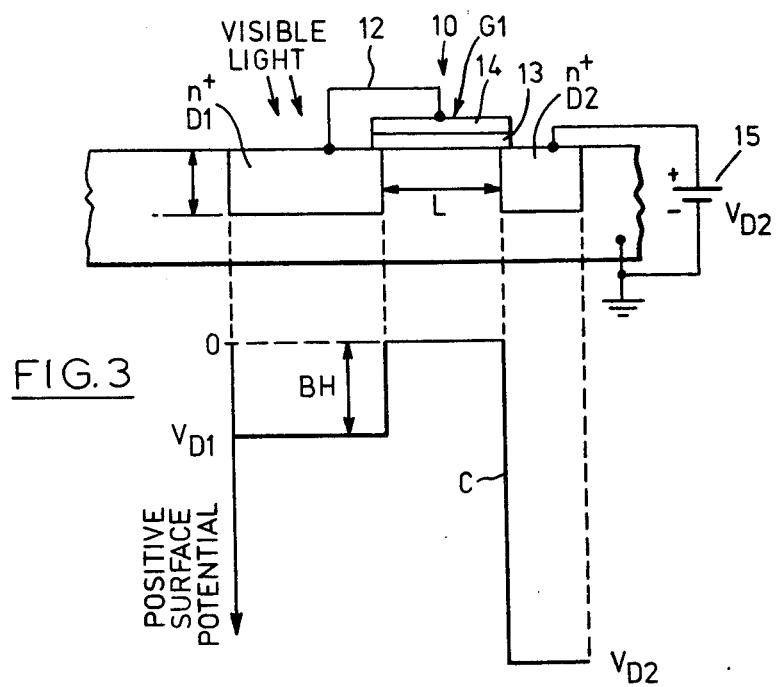
FIG. 3 is a view similar to that of FIG. 2 but additionally shown the surface potential profile of the structure with a long channel length (L)

Reference now will be made to FIG. 3. In that Figure the potential-well profile along the length of the photodetector structure is shown by curve C. If D1, D2 and G1 are allowed to act as a special MOSFET device with zero potential between G1 and substrate 11, G1 connected to source D1 and $V_{D2}$ applied to drain D2, it will be seen from curve C that the channel between regions D1 and D2 will be completely off due to the potential barrier BH. As a consequence, there will be no current flow between source D1 and drain D2 even though a potential $V_{D2}$ exists between the drain and source. Thus, since BH is large, the subthreshold current of this device in this mode is zero.

Figure 4:
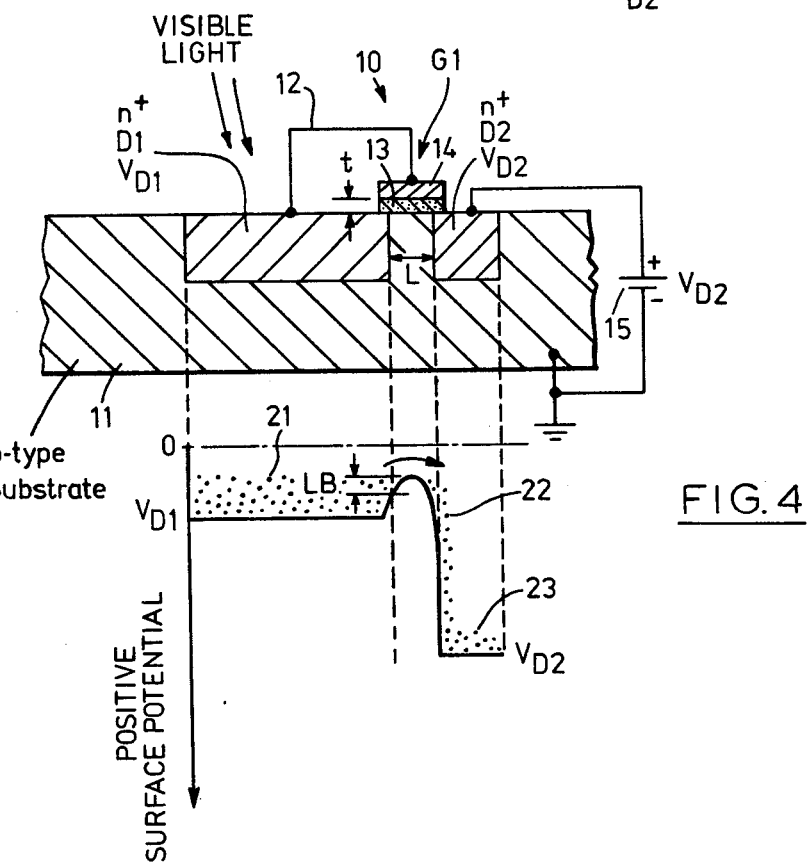
FIG. 4 is a view similar to that of FIG. 2 but additionally showing the surface potential profile of the structure with a short effective channel length (L) and photogenerated carriers collected by D1. This figure also shows photogenerated carriers injected over the source-channel barrier and collected and drained out by D2.

However, in accordance with the instant invention, with appropriate selection of physical channel length, junction depth d of diffusion regions D1 and D2 and resistivity of substrate 11, it is possible for feedback between regions D1 and D2 to take place such that the electric field of region D2 can penetrate the channel and terminate on region D1. This will result in lowering the potential barrier height BH between source D1 and the channel under gate G1, and this now will become LB, as shown in FIG. 4. The potential barrier height BH also can be externally controlled by the magnitude of bias $V_{D2}$.

In accordance with this invention, by appropriate selection of the parameters hereinbefore noted, the potential barrier LB of FIG. 4 can be made sufficiently lower than the potential barrier BH of FIG. 3 that excess photogenerated electrons 21 (FIG. 4) can be injected from source D1 into the channel and then collected by drain D2. The resulting current is a photo-subthreshold current. Under dark conditions the subthreshold current normally is very small and much less than a nanoampere depending, of course, on the dimensions of the photodetector structure.

It will be apparent from the foregoing that it is essential to the instant invention that the aforementioned parameters be selected so as to lower the potential barrier between source D1 and the channel under gate G1 to a point where electrons can be injected from source D1 into the channel. Some typical and strictly exemplary values are given in Table I.

TABLE I

| SOME TYPICAL DIMENSIONS AND PHYSICAL PARAMETERS OF THE NEW PHOTODETECTOR STRUCTURE | | | | |
|---|---|---|---|---|
| | DEVICE #1 | DEVICE #2 | DEVICE #3 | DEVICE #4 |
| GATE OXIDE THICKNESS (t) OF G1 | 410A | 410A | 190A | 250A |
| EFFECTIVE CHANNEL LENGTH (L) OF G1 | 1.0 μm | 2.0 μm | 1.0 μm | 1.5 μm |
| CHANNEL WIDTH (W) OF G1 | 6.0 μm | 6.0 μm | 6.0 μm | 5.0 μm |
| JUNCTION DEPTH d OF DIFFUSIONS | 0.5 μm | 0.7 μm | 0.75 μm | 0.5 μm |

TABLE I-continued

SOME TYPICAL DIMENSIONS AND PHYSICAL PARAMETERS
OF THE NEW PHOTODETECTOR STRUCTURE

|  | DEVICE #1 | DEVICE #2 | DEVICE #3 | DEVICE #4 |
|---|---|---|---|---|
| SUBSTRATE DOPING | $3.25 \times 10^{16}$ cm$^{-3}$ | $3.2 \times 10^{16}$ cm$^{-3}$ | $2.5 \times 10^{16}$ cm$^{-3}$ | $6.0 \times 10^{15}$ cm$^{-3}$ |
| TYPE OF DEVICE | P | P | N | N |
| TYPE OF CHANNEL | CHANNEL | CHANNEL | CHANNEL | CHANNEL |
| CHANNEL ION IMPLANT ACCEPTOR CONC. | — | — | — | $10 \times 10^{15}$ cm$^{-3}$ |
| DEPTH OF IMPLANTED CHANNEL | — | — | — | 0.2 μm |

Figure 6:
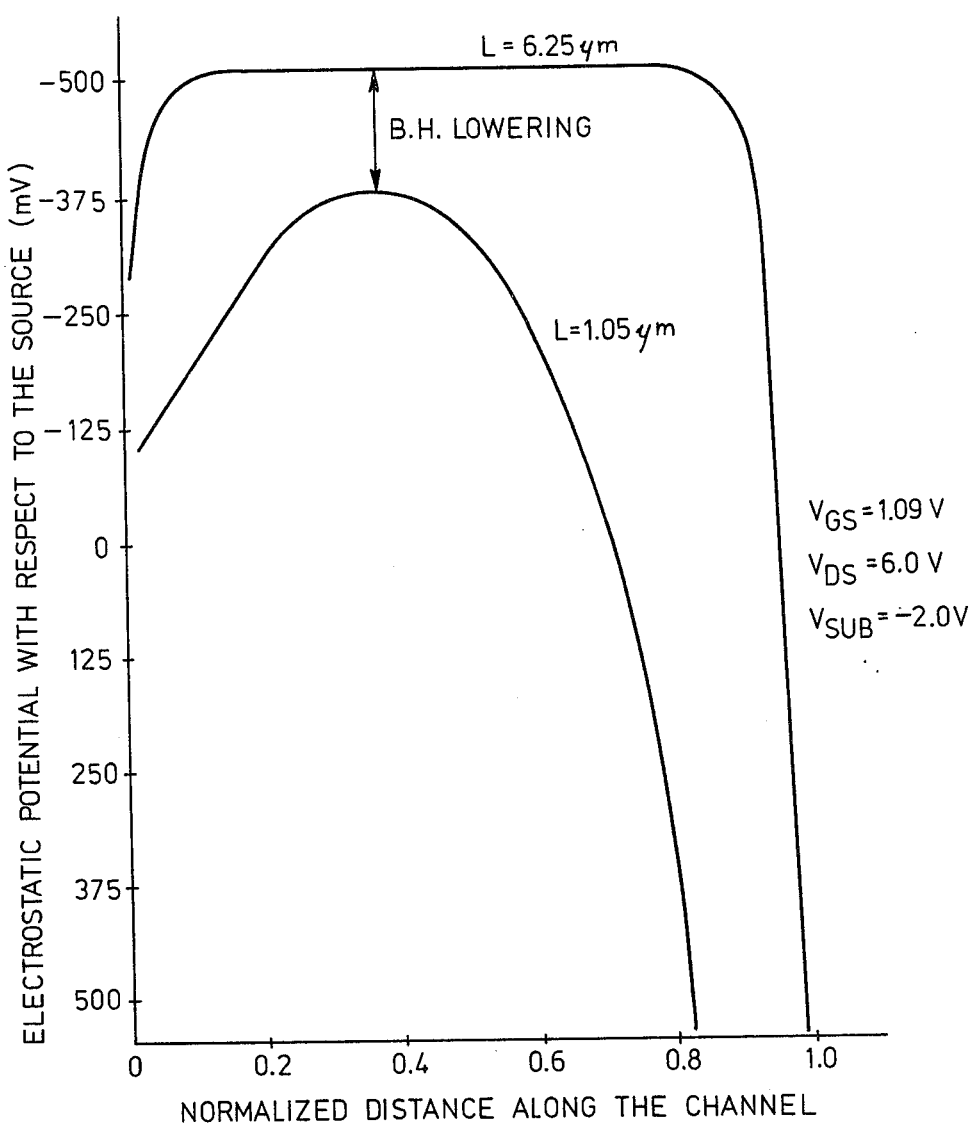
FIG. 6 shows curves indicating the surface potential profiles along the channel for short and long channel devices.

The surface potential along the channel for a short channel device and a long channel device as calculated by Poisson's equation using the method of reference 3a, is shown in FIG. 6. Defined in this plot is the change in the minimum value of the surface potential while the long channel device becomes a short channel device. The channel region of these devices was not ion-implanted. The doping density of the channel region was similar to that of the substrate doping. It should be noted that both devices were under subthreshold conditions. In this respect, for both the gate-to-source bias was +1.09 V, with a substrate bias of −2.0 V, and a drain-to-source bias of +6.0 V. The barrier height lowering for the short channel device relative to the long channel device is clearly seen in FIG. 6.

Similarly, the barrier height lowering with reference to a long channel device easily can be computed using the methods outlined in references 3a and 3b, or similar methods for any device dimension, and for each different case, by varying in many different combinations, the source and drain diffusion depths, the substrate doping, the channel-ion-implant doping density, source to drain bias and other bias conditions, and for a given channel length. Each combination of parameters will give different values. However, a person competent in the field of modern semiconductor MOSFET devices, with the aid of references 3a and 3b or similar methods to those outlined therein will be able to evaluate the source-barrier-height lowering. Using the methods outlined in references 3a and 3b, the source-barrier-height lowering as a function of source-to-drain voltage bias under subthreshold conditions and with a substrate bias of −3.0 V for three MOSFET devices with different channel lengths is shown in Table II. The physical and geometrical parameters of all three of the devices are shown in Table III.

TABLE II

Substrate Bias = −3.0 V

CHANGE IN SOURCE POTENTIAL
RELATIVE TO THE CONDITION
OF $V_{DS}$ = 1.0 V in mV

| DRAIN TO SOURCE BIAS ($V_{DS}$) (Volts) | CHANNEL LENGTH 8.33 μm | CHANNEL LENGTH 3.2 μm | CHANNEL LENGTH 1.7 μm | CHANNEL LENGTH 1.0 μm |
|---|---|---|---|---|
| 1.0 | 0 | 0 | 0 | 0 |
| 2.0 | 0.5 | 6 | 50 | 100 |
| 3.0 | 1.0 | 10 | 100 | 190 |
| 4.0 | 1.5 | 15 | 125 | 260 |
| 5.0 | 1.8 | 18 | 170 | 320 |
| 6.0 | 2.0 | 22 | 210 | 405 |
| 7.0 | 2.6 | 25 | 250 | 500 |
| 8.0 | 3.0 | 34 | 290 | 580 |

*NOTE
μm = $10^{-6}$ meters
mV = $10^{-3}$ Volts

TABLE III

Physical and Geometrical
Parameters of the MOSFET
Devices Used

| | |
|---|---|
| Substrate doping: | p-type $6.0 \times 10^{15}$ cm$^{-3}$ |
| Gate Oxide thickness: | $0.0517 \times 10^{-4}$ cm |
| Diffusion depth of source and drain: | $0.675 \times 10^{-4}$ cm |
| Channel ion-implant: | no channel ion-implant. The doping density of the channel was equal to that of the substrate doping density, i.e., $6.0 \times 10^{15}$ cm$^{-3}$ |

If region D1 of FIG. 4 is illuminated with visible radiation, region D1 will act as a reversed bias junction and will collect the electrons 21 that are photogenerated in substrate 11. The photogenerated holes will travel to the bulk of substrate 11. Photogenerated electrons 21 collected by diffusion region D1 will be injected over the barrier (LB) into the channel, as shown at 22 (FIG. 4) and finally will be drained out by drain D2 as shown at 23 (FIG. 4). Once the collected electrons are injected by region D1 into the channel, the voltage $^VD1$ of region will move more positive depending upon the number of electrons injected into the channel. Since the number of photogenerated electrons 21 is a function of the light intensity of the incident radiation, the voltage $^VD1$ of the photosensing region D1 in turn is a function of the incident light intensity. Injection of electrons over the barrier LB by source D1 and the resulting voltage $^VD1$ of source D1 is a natural logarithmic relationship. Thus, when photosensing region D1 is illuminated, its voltage $V_{D1}$ is a natural logarithmic function of the incident light intensity. Since the signal voltage $V_{D1}$ changes logarithmically with respect to incident light intensity, the signal voltage $V_{D1}$ does not increase unnecessarily i.e., it increases within a practical range, and does not reach saturation even though the incident light intensity may increase relatively by a factor of 10 million. On a realized device a signal of $V_{D1} = 2.8$ V at a light intensity of $3.1 \times 10^{-8}$ w. cm$^{-2}$, and $V_{D1} = 0.1$ V at a light intensity of $3.1 \times 10^{-1}$ w. cm$^{-2}$ was obtained. This shows, with the present signal level conditions, that a dynamic range of $10^7$ was easily achieved. The novel photodetector device of this invention can satisfactorily provide a detection light intensity dynamic range of over $10^9$.

Figure 5A:
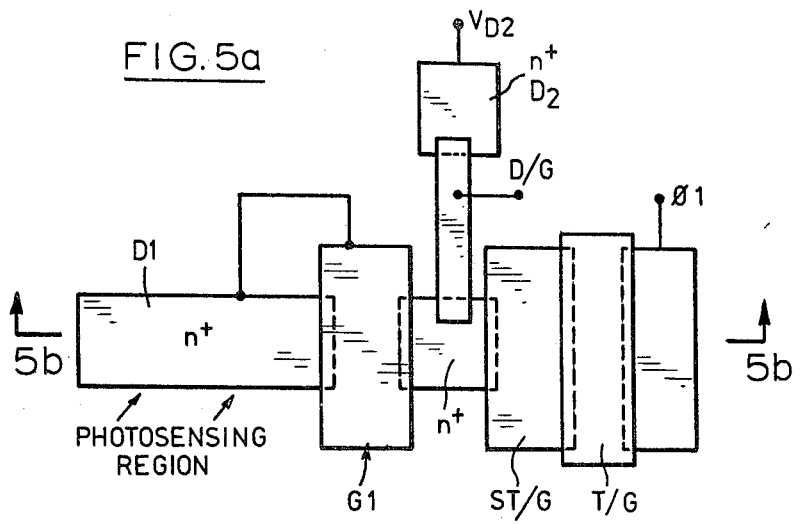
FIG. 5a is a plan view of a photodetector structure embodying the present invention used with a CCD readout shift register.
Figure 5B:
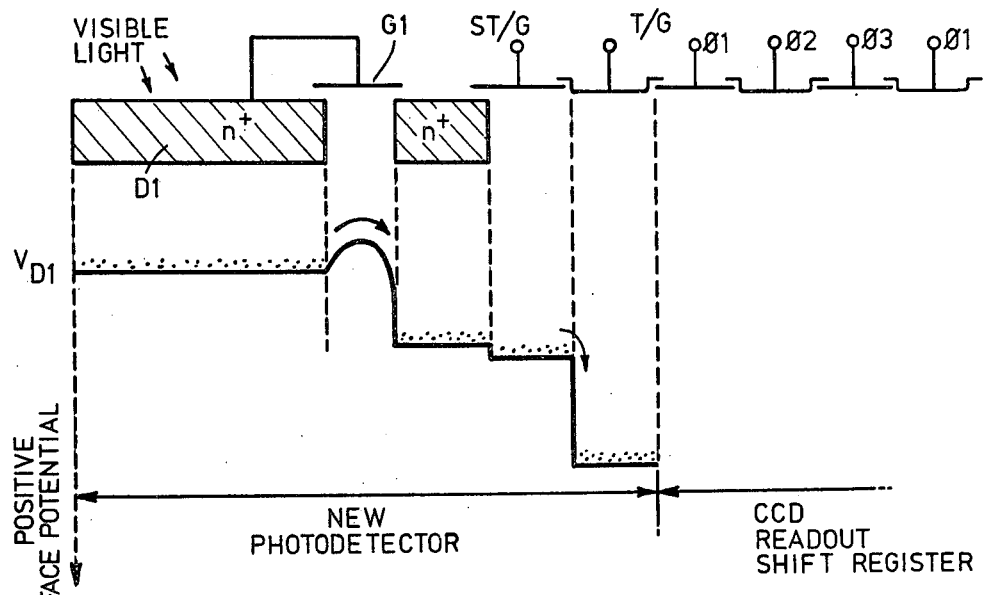

As previously indicated, the photodetector structure of the present invention easily can be associated with MOFSET circuits and CCDs to form linear and area arrays. The signal voltage $V_{D1}$ can be used easily to generate an equivalent amount of signal charge and readout by a CCD readout shift register. One way of utilizing the new photodetector structure to form linear and area arrays with CCD readout shift registers is shown in FIG. 5. The photogenerated electrons normally are drained by $V_{D2}$ through the gate D/G. When photocharge is required to be injected into the CCD shift register, D/G is closed, ST/G is at high potential and photocharge is transferred into the CCD shift register by the normal CCD transfer method. With the arrangement shown in FIG. 5, if the incoming radiation is weak, the signal can be built up by taking successive samples.

While preferred embodiments of this invention have been disclosed herein, those skilled in the art will appreciate that changes and modifications may be made therein without departing from the spirit and scope of the invention as defined in the appended claims.

I claim:

1. An integrable photodetector element having a large dynamic range comprising a silicon substrate having a resistivity of between 1 and 100 ohm-cm and being of one conductivity type; an electrically floating photosensitive diffusion region in said substrate; a second diffusion region in said substrate spaced apart from said electrically floating photosensitive diffusion region by a channel in said substrate, said diffusion regions both being of the same conductivity type and of opposite conductivity type to that of said substrate; a metal-insulator-semiconductor gate spanning said substrate between said regions and over said channel; means electrically connecting said gate and said electrically floating photosensitive diffusion region; means for reverse biasing said second diffusion region with respect to said substrate; said element except for said photosensitive diffusion region being shielded against penetraton by visible light; the length of said channel between said regions, the resistivity of said substrate, the magnitude of said reverse bias and the depth of said diffusion regions being selected such that the potential barrier between said electrically floating photosensitive diffusion region and said channel is low enough that electrons photogenerated in response to visible light impinging on said electrically floating photosensitive diffusion region can be injected from said electrically floating photosensitive diffusion region into said channel to be collected by said second diffusion region, the voltage of said electrically floating photosensitive diffusion region thereby varying logarithmically with changes in visible light incident thereon.

2. An element according to claim 1 wherein said substrate is of p-type conductivity and said diffusion regions are of n-type conductivity.

3. An element according to claim 2 wherein said diffusion regions have a doping density in the region of from $10^{15}$ cm$^{-3}$ to $10^{21}$ cm$^{-3}$.

4. An element according to claim 1 wherein said metal-insulator-semiconductor gate is a polysilicon-SiO$_2$-semiconductor gate.

5. An element according to claim 1 wherein said channel is ion implanted.

6. An element according to claim 1 including a MOSFET device having a source, a drain and a gate, and means electrically connecting said gate of said MOSFET and said electrically floating photosensitive diffusion region.

* * * * *